United States Patent
Inomata et al.

(10) Patent No.: US 9,638,848 B2
(45) Date of Patent: May 2, 2017

(54) PATTERNED PHASE DIFFERENCE FILM AND METHOD FOR MANUFACTURING SAME

(71) Applicant: DAI NIPPON PRINTING CO., LTD., Tokyo (JP)

(72) Inventors: Yuya Inomata, Tokyo (JP); Kumiko Kambara, Tokyo (JP); Masanori Fukuda, Tokyo (JP); Hideki Usuki, Tokyo (JP); Keiji Kashima, Tokyo (JP); Kazuki Yamada, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 364 days.

(21) Appl. No.: 14/351,346

(22) PCT Filed: Oct. 1, 2012

(86) PCT No.: PCT/JP2012/075328
§ 371 (c)(1),
(2) Date: Apr. 11, 2014

(87) PCT Pub. No.: WO2013/054673
PCT Pub. Date: Apr. 18, 2013

(65) Prior Publication Data
US 2014/0268002 A1    Sep. 18, 2014

(30) Foreign Application Priority Data

Oct. 14, 2011    (JP) .................................. 2011-226771
Mar. 1, 2012    (JP) .................................. 2012-045592

(51) Int. Cl.
*G02B 5/30*    (2006.01)
*G02B 27/22*    (2006.01)
(Continued)

(52) U.S. Cl.
CPC ........... *G02B 5/3016* (2013.01); *G02B 27/26* (2013.01); *G02F 1/13363* (2013.01);
(Continued)

(58) Field of Classification Search
CPC ..... G03F 7/0005; G02B 5/3016; G02B 27/26; G02F 1/133528
(Continued)

(56) References Cited

U.S. PATENT DOCUMENTS 5,602,661 A * 2/1997 Schadt .................. C08F 246/00
349/117
2005/0128380 A1    6/2005 Zieba et al.
(Continued)

FOREIGN PATENT DOCUMENTS

EP    0 772 069 A1    5/1997
EP    1 542 065 A1    6/2005
(Continued)

OTHER PUBLICATIONS

Computer-generated translation of KR 2011-0109449 (Oct. 2011).*
(Continued)

*Primary Examiner* — John A McPherson
(74) *Attorney, Agent, or Firm* — Oliff PLC

(57) ABSTRACT

A pattern phase difference film is manufactured by a process including a laminate body formation step of applying a pattern alignment layer composition on a substrate to form a laminate body, a heat-drying layer formation step of heat-drying the composition to form a heat-dried layer, a pattern alignment layer formation step of irradiating a polarization pattern onto the heat-dried layer to form a pattern alignment layer, and a phase difference layer formation step of forming a phase difference layer including a rod-shaped compound on the pattern alignment layer. During the steps between the heat-drying layer formation step and the phase
(Continued)

difference layer formation step, the heat-dried layer and the pattern alignment layer are exposed to the air for four hours or less.

8 Claims, 5 Drawing Sheets

(51) Int. Cl.
  *G03F 7/00* (2006.01)
  *G02B 27/26* (2006.01)
  *G02F 1/1335* (2006.01)
  *G02F 1/13363* (2006.01)

(52) U.S. Cl.
  CPC ...... *G02F 1/133528* (2013.01); *G03F 7/0005* (2013.01); *G02F 2001/133548* (2013.01)

(58) Field of Classification Search
  USPC .................................. 430/321; 349/117, 194
  See application file for complete search history.

(56) References Cited

U.S. PATENT DOCUMENTS

| | | |
|---|---|---|
| 2005/0208231 A1 | 9/2005 | Nimura et al. |
| 2012/0162572 A1 | 6/2012 | Okuno et al. |
| 2013/0121228 A1 | 5/2013 | Rost et al. |

FOREIGN PATENT DOCUMENTS

| | | |
|---|---|---|
| JP | A-06-289374 | 10/1994 |
| JP | A-2005-049865 | 2/2005 |
| JP | A-2005-173621 | 6/2005 |
| JP | A-2005-292241 | 10/2005 |
| JP | A-2007-102236 | 4/2007 |
| JP | A-2007-333981 | 12/2007 |
| JP | A-2009-025732 | 2/2009 |
| JP | A-2009-265290 | 11/2009 |
| JP | A-2010-070505 | 4/2010 |
| JP | A-2010-230886 | 10/2010 |
| JP | A-2011-221228 | 11/2011 |
| JP | 2012121144 A | 6/2012 |
| JP | A-2012-150428 | 8/2012 |
| JP | A-2012-168514 | 9/2012 |
| JP | A-2013-538495 | 10/2013 |
| KR | 2011-0109449 | * 10/2011 |
| KR | 2011-0109451 | * 10/2011 |
| WO | WO 2012/018121 A1 | 2/2012 |
| WO | 2012124323 A1 | 9/2012 |

OTHER PUBLICATIONS

Computer-generated translation of KR 2011-0109451 (Oct. 2011).*
Office Action issued in Japanese Patent Application No. 2013-538495 mailed Jul. 1, 2014.
Oct. 28, 2014 Office Action issued in Japanese Application No. 2013-538495.
Jan. 8, 2013 International Search Report issued in International Application No. PCT/JP2012/075328 (with translation).
Jan. 17, 2017 Office Action issued in U.S. Appl. No. 15/228,288.

* cited by examiner

PATTERNED PHASE DIFFERENCE FILM AND METHOD FOR MANUFACTURING SAME

TECHNICAL FIELD

The present invention relates to a patterned phase difference film and a method for producing the patterned phase difference film.

BACKGROUND ART

Recently, flat panel display devices capable of performing 3D display have drawn much attention, and some of them are coming into the market. Since it is expected that future flat panel display devices will tend to be naturally required to have a 3D display function, flat panel display devices capable of performing 3D display have been widely researched in a wide range of fields.

In general, in order to perform the 3D display in the flat panel display device, a right-eye image or a left-eye image need to be selectively applied to each eye of a viewer in a certain method. For example, as a method for selectively applying the right-eye image and the left-eye image, a passive-type 3D display system is known. The passive-type 3D display system will be described with reference to the drawings. FIG. 5 is a schematic diagram illustrating an example of a passive-type 3D display. As illustrated in FIG. 5, in this passive-type 3D display system, first, pixels constituting a flat panel display are divided into two types of a plurality of pixels in a pattern shape, that is, pixels for displaying the right-eye image and pixels for displaying the left-eye image. The right-eye image is displayed by one group of the pixels, and the left-eye image is displayed by the other group of the pixels. In addition, by using a linearly polarizing plate and a patterned phase difference film where a phase difference layer having a pattern shape corresponding to the division pattern of the pixels is formed, the right-eye image and the left-eye image are converted into circularly polarized light beams which are perpendicular to each other. A viewer wears circular polarization glasses including circular polarization lenses of which the directions of polarization are perpendicular to each other, attached on the right-eye lens and the left-eye lens. The right-eye image is allowed to pass through only the right-eye lens, and the left-eye image is allowed to pass through only the left-eye lens. In this manner, in the passive type, 3D display can be performed by allowing the right-eye image to enter only the right eye and allowing the left-eye image to enter only the left eye.

In the passive type, there is an advantage in that 3D display can be easily performed by using the above-described patterned phase difference film and the corresponding circular polarizing glasses.

However, although the patterned phase difference film has been necessarily employed in the passive type as described above, the patterned phase difference film has not been widely researched and developed, and no standard technique has been established as of yet. As an example, a patterned phase difference film including a photo-alignment film which is formed on a substrate and of which an alignment regulation force is controlled in a pattern shape and a phase difference layer which is formed on the photo-alignment film and in which an arrangement of liquid crystal compound is patterned so as to correspond to the pattern of the photo-alignment film is proposed (refer to Patent Document 1).

[Patent Document 1] Japanese Unexamined Patent Application, Publication No. 2005-49865

DISCLOSURE OF THE INVENTION

Problems to be Solved by the Invention

However, during the formation of the photo-alignment film, if a composition contained in the photo-alignment film is exposed to air, the photo-alignment property of the photo-alignment film deteriorates.

The present invention has been achieved in view of the above-described circumstances and the object thereof is to provide a patterned phase difference film having high photo-alignment property in comparison to a patterned phase difference film in the related art.

Means for Solving the Problems

The inventor of the present invention conducted thorough investigations in order to solve the above-described problems and found out that a pattern alignment layer is formed by coating a substrate with a pattern alignment layer composition, heating and drying the pattern alignment layer composition, and irradiating the heat-dried layer with a polarized light pattern, and if the heat-dried layer and the pattern alignment layer is prevented from being exposed to air until a phase difference layer containing a rod-like compound is formed on the pattern alignment layer, it is possible to prevent deterioration in photo-alignment property, so that the inventors accomplished the present invention. More specifically, the present invention provides the following aspects.

(1): According to an aspect of the present invention, a patterned phase difference film is provided including: a substrate; a pattern alignment layer which is formed on the substrate and in which an alignment pattern is formed; and a phase difference layer which is formed on the pattern alignment layer and contains a polymerizable liquid crystal composition, wherein black luminance at an extinction position of polarizing plates at a crossed-nicols state is 10 cd/cm$^2$ or less.

(2) According to another aspect of the present invention, an optical laminate is provided including the patterned phase difference film described in the aspect (1).

(3) According to still another aspect of the present invention, a method is provided for manufacturing a patterned phase difference film including: forming a laminate by coating a substrate with a pattern alignment layer composition for forming a pattern alignment layer containing a photo-alignment material exhibiting a photo-alignment property through irradiation of polarized light; forming a heat-dried layer by heating and drying the pattern alignment layer composition after the forming of the laminate; forming a pattern alignment layer having a different photo-alignment property by irradiating the heat-dried layer with a polarized light pattern after forming the heat-dried layer; and forming a phase difference layer containing a rod-like compound having a polymerizable functional group in a molecule exhibiting liquid crystal characteristics on the pattern alignment layer after the forming of the pattern alignment layer, wherein the exposure time when the heat-dried layer and the pattern alignment layer are exposed to air is four hours or less during the processes from the forming of the heat-dried layer to the forming of the phase difference layer.

(4) In addition, in the method for manufacturing the patterned phase difference film described in the aspect (3), the exposure time is four hours or less by allowing the laminate to be wound and retained in a roll shape after forming the heat-dried layer or after forming the pattern alignment layer.

(5) In addition, in the method for manufacturing the patterned phase difference film described in the aspect (3), the exposure time is four hours or less by continuously performing the processes from the forming of the heat-dried layer to the forming of the phase difference layer in the same production line.

Effects of the Invention

According to the present invention, it is possible to provide a patterned phase difference film having high photo-alignment property in comparison to a patterned phase difference film in the related art.

EXPLANATION OF REFERENCE NUMERALS

1: Pattern alignment film
2: Patterned phase difference film
11: Substrate
12: Pattern alignment layer
13: Phase difference layer

PREFERRED MODE FOR CARRYING OUT THE INVENTION

Hereinafter, specific embodiments of the present invention will be described in detail. However, the present invention is not limited to the below-described embodiments, but it may be appropriately modified within the scope of the present invention.

1. Formation of Pattern Alignment Film 1

Figure 1:
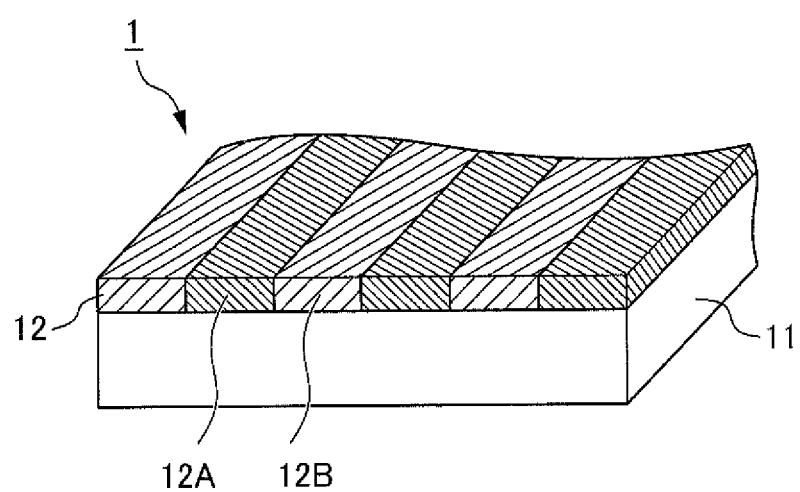
FIG. 1 is a schematic diagram illustrating a pattern alignment film.

FIG. 1 is a schematic diagram illustrating a pattern alignment film 1. The pattern alignment film 1 is an intermediate product of a patterned phase difference film which is to be obtained according to the manufacturing method of the present invention. The pattern alignment film 1 can be obtained by performing a laminate formation process of forming a laminate by coating a substrate 11 with a pattern alignment layer composition for forming a pattern alignment layer containing a photo-alignment material exhibiting photo-alignment property through irradiation of polarized light, a heat-dried layer formation process of forming a heat-dried layer (reference numeral 12' in FIGS. 2A and 2B) by heating and drying the pattern alignment layer composition after the laminate formation process, and a pattern alignment layer formation process of forming a pattern alignment layer 12 having a different photo-alignment property through irradiation of a polarized light pattern on the heat-dried layer 12' after the heat-dried layer formation process. Hereinafter, the above-mentioned processes will be described.

Laminate Formation Process

In the laminate formation process, the laminate is formed by applying the pattern alignment layer composition for forming the pattern alignment layer 12 containing the photo-alignment material exhibiting photo-alignment property through irradiation of polarized light onto the substrate 11.

[Substrate 11]

The substrate 11 is a transparent film material, has a function of supporting the pattern alignment layer 12, and is formed in an elongated shape.

The substrate 11 preferably has a small phase difference, and the in-plane phase difference (in-plane phase retardation value and, hereinafter, also referred to as a "Re value") thereof is preferably in the range of 0 nm to 10 nm, more preferably, in the range of 0 nm to 5 nm, and much more preferably, in the range of 0 nm to 3 nm. If the Re value exceeds 10 nm, display quality of a flat panel display using a pattern alignment film may be deteriorated. Therefore, it is not preferable.

Here, the Re value refers to an index indicating the degree of birefringence in the in-plane direction of a refractive index anisotropic body. If the refractive index in the phase delaying axis direction, which is the largest refractive index in the in-plane direction, is denoted by Nx, the refractive index in the phase advancing axis direction perpendicular to the phase delaying axis direction is denoted by Ny, and the thickness in the direction perpendicular to the in-plane direction of the refractive index anisotropic body is denoted by d, the Re value is expressed by the following equation.

$$Re\ [\text{nm}]=(Nx-Ny)\times d\ [\text{nm}]$$

For example, the Re value may be measured according to a parallel-nicols rotation method by using the phase difference measuring apparatus KOBRA-WR (produced by Oji Scientific Instruments). In addition, in this specification, unless there is no particular statement, the Re value is intended to be a value at a wavelength of 589 nm.

The transmittance of the substrate 11 in the visible range is preferably 80% or more, and more preferably 90% or more. Herein, the transmittance of the transparent film substrate may be measured by JIS K7361-1 (Test Method: Plastics-Determination of the total luminous transmittance of transparent materials).

The substrate 11 is preferably a flexible material having flexibility which can be wound into a roll shape. Examples of such a flexible material may be cellulose derivatives, norbornene polymers, cyclo-olefin-based polymers, polymethyl methacrylate, polyvinyl alcohol, polyimide, polyarylate, polyethylene terephthalate, polysulfone, polyether sulfone, amorphous polyolefin, modified acrylic-based polymers, polystyrene, epoxy resins, polycarbonate, polyesters, and the like. Among them, in terms that the pattern alignment film having excellent optical isotropy and excellent optical characteristics can be manufactured, the cellulose derivative is preferably used.

Among the cellulose derivatives, in terms of wide industrial usability and high availability, cellulose esters are preferably used, and cellulose acylates are more preferably used.

Lower fatty acid esters having 2 to 4 carbon atoms are preferable as the cellulose acylates. Only a single lower fatty acid ester such as cellulose acetate may be included, or a plurality of fatty acid esters such as cellulose acetate butyrate or cellulose acetate propionate may be included as the lower fatty acid esters.

Among lower fatty acid esters, cellulose acetate may be very appropriately used. TAC having an average degree of acetylation of 57.5% to 62.5% (degree of substitution: 2.6 to 3.0) is most preferably used as the cellulose acetate. Herein, the degree of acetylation denotes the amount of a combined acetic acid per unit mass of cellulose. The degree of acetylation may be obtained by measurement and calculation of the degree of acetylation according to ASTM: D-817-91 (Test Method for Cellulose Acetate or the like). In addition, the degree of acetylation of the TAC may be obtained by using the above-described method after removing impurities such as plasticizer contained in the film.

If the thickness of the substrate 11 is in a range where a self-supporting property necessary for the phase difference film can be applied according to a purpose or the like of the phase difference film manufactured by using the pattern alignment film, the thickness is not particularly limited. In general, the thickness of the substrate 11 is preferably in the range of 25 μm to 125 μm, more preferably in the range of 30 μm to 100 μm, and even more preferably in the range of 40 μm to 80 μm. If the thickness is less than 25 μm, there is a case where the self-supporting property necessary for the phase difference film cannot be applied. Therefore, it is not preferable. If the thickness exceeds 125 μm, in the case where the phase difference film has an elongated shape, when obtaining a plurality of sheets of phase difference films by cutting and machining the elongated phase difference film, processing waste may be increased, or the cutting blade may be worn fast. Therefore, it is not preferable.

The substrate 11 is not limited to the configuration where the substrate is configured with a single layer. The substrate 11 may have a configuration where a plurality of layers are laminated. In the case where the substrate 11 has a configuration where a plurality of layers are laminated, the layers having the same composition may be laminated, or the layers having different compositions may be laminated.

[Provision of Substrate 11]

If the elongated film can be continuously transported, the method of providing the substrate 11 is not particularly limited. The method of using a general transporting unit may be used. More specifically, a method of using an unwinding machine supplying a roll-shaped elongated film and a winding machine winding the elongated film, a method of using a belt conveyor, a transporting roll, and the like may be exemplified. In addition, a method of using a floating type transporting carriage for transporting an elongated alignment layer formation film in a floated state by performing air ejection and suction may be exemplified.

In addition, if an elongated film can be stably and continuously transported, existence of exertion of tension on the elongated film during the transportation is not particularly limited. However, the elongated film is preferably transported in a state where a predetermined tension is exerted. This is because it is possible to perform continuous transportation more stably.

As the color of the transporting unit, in a case where the transporting unit is arranged at a portion in which the elongated film is irradiated with polarized UV light, a color which does not reflect the polarized UV light passing through the elongated film is preferable. More specifically, black is preferable as the color of the transporting unit. As a method of obtaining the black color, for example, a method of treating the surface with chromium may be exemplified.

If the elongated film can be stably transported, the shape of the transporting roll is not particularly limited. In the case where the transporting roll is arranged at the portion in which the elongated film is irradiated with the polarized UV light, a shape capable of maintaining a constant distance between the surface of the elongated film and the UV light irradiation apparatus is preferable, and in general, a circular shape is preferable.

[Pattern Alignment Layer Composition]

The pattern alignment layer composition contains a photo-alignment material exhibiting photo-alignment property through irradiation of polarized light and a solvent dissolving the photo-alignment material.

(Photo-Alignment Material)

The photo-alignment material denotes a material which can exhibit an alignment regulation force through irradiation of polarized UV light. The alignment regulation force denotes a function of aligning a rod-like compound in a predetermined direction when an alignment layer including a photo-alignment material is formed and a layer of the rod-like compound is formed on the alignment layer.

The photo-alignment material is not particularly limited if the material exhibits the above-mentioned alignment regulation force through irradiation of polarized light. The photo-alignment materials may be roughly divided into a photoisomerization material which reversibly changes the alignment regulation force by changing only the molecular shape due to cis-trans change and a photoreactive material which changes the molecule itself via irradiating polarized light. In the present invention, although either the photoisomerization material or the photoreactive material may be appropriately used, the photoreactive material is more preferably used. The reason is as follows. Since the photoreactive material reacts with the molecules through irradiation of polarized light to exhibit an alignment regulation force, the photoreactive material can irreversibly exhibit the alignment regulation force. Therefore, the photoreactive material is excellent in temporal stability of the alignment regulation force.

The photoreactive material may be further classified according to the type of reaction generated through irradiation of polarized light. More specifically, the photoreactive material may be classified into a photodimerization type material exhibiting an alignment regulation force by generating a photodimerization reaction, a photolysis type material exhibiting an alignment regulation force by generating a photolysis reaction, a photo-coupling type material exhibiting an alignment regulation force by generating a photo-coupling reaction, a photolysis-coupling type material exhibiting an alignment regulation force by generating a photolysis reaction and a photo-coupling reaction, and the like. In the present invention, any one of the above-mentioned photoreactive materials may be very appropriately used. In terms of stability, reactivity (sensitivity), and the like, the photodimerization type material is preferably used.

If the photodimerization type material is a material which can exhibit an alignment regulation force by generating the photodimerization reaction, the photodimerization type material is not particularly limited. However, in terms of a good alignment regulation force, a photodimerization type material corresponding to a wavelength of light generating the photodimerization reaction which is in the range of 280 nm or more is preferable; a photodimerization type material corresponding to the wavelength which is in the range of 280 nm to 400 nm is more preferable; and a photodimerization type material corresponding to the wavelength which is in the range of 300 nm to 380 nm is even more preferable.

As photodimerization material, a polymer having cinnamate, coumarin, benzylidene phthalimidine, benzylidene acetophenone, diphenylacetylene, stilbazole, uracil, quinolinone, maleic imide, or a cinnamylidene acetic acid derivative may be exemplified. Among them, in terms of a good alignment regulation force, a polymer containing one or both of cinnamate and coumarin is preferably used. As specific examples of the photodimerization type material, compounds disclosed in Japanese Unexamined Patent Application, Publication No. 9-118717, PCT Patent Publication No. 10-506420, PCT Patent Publication No. 2003-505561, WO 2010/150748, WO 2011/126019, WO 2011/126021, and WO 2011/126022 may be exemplified.

The cinnamate and the coumarin expressed by the following Chemical Formulas Ia and Ib may be very appropriately used.

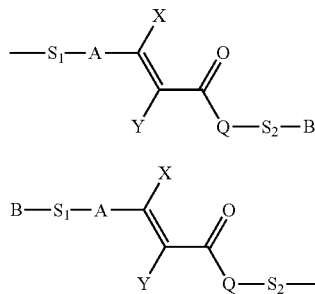

In the above-mentioned Chemical Formula, A represents pyrimidine-2,5-diyl, pyridine-2,5-diyl, 2,5-thiophenylene, 2,5-furanylene, 1,4- or 2,6-naphthylene or represents phenylene which is unsubstituted or mono- or poly-substituted by fluorine, chlorine, or cyclic, straight-chain, or branched-chain alkyl residue having 1 to 18 carbon atoms (unsubstituted, mono- or poly-substituted by fluorine or chlorine, or one or more non-adjacent —$CH_2$— groups may be independently substituted by a group C.)

In the above-mentioned Chemical Formula, B represents a hydrogen atom or represents a second substance, for example, a polymer, an oligomer, a monomer, a photoactive polymer, or a group capable of reacting or interacting with a photoactive oligomer and/or a photoactive monomer or surface.

In the above-mentioned Chemical Formula, C represents a group selected from —O—, —CO—, —CO—O—, —O—CO—, —$NR_1$—, —$NR_1$—CO—, —CO—$NR_1$—, —$NR_1$—CO—O—, —O—CO—$NR_1$—, —$NR_1$—CO—$NR_1$—, —CH=CH—, —C≡C—, —O—CO—O—, and $Si(CH_3)_2$—O—$Si(CH_3)_2$— ($R_1$ represent a hydrogen atom or lower alkyl).

In the above-mentioned Chemical Formula, D represents a group selected from —O—, —CO—, —CO—O—, —O—CO—, —$NR_1$—, —$NR_1$—CO—, —CO—$NR_1$—, —$NR_1$—CO—O—, —O—CO—$NR_1$—, —$NR_1$—CO—$NR_1$—, —CH=CH—, —C≡C—, —O—CO—O—, and $Si(CH_3)_2$—O—$Si(CH_3)_2$— ($R_1$ represent a hydrogen atom or lower alkyl), an aromatic group, or an alicyclic group.

In the above-mentioned Chemical Formula, $S_1$ and $S_2$ independently represent single-bond alkylene groups or straight-chain or branched chain alkylene groups having 1 to 40 carbon atoms as spacer units (unsubstituted, mono- or poly-substituted by fluorine or chlorine, or one or more non-adjacent —$CH_2$— groups may be independently substituted by a group D).

In the above-described formula, Q represents an oxygen atom or $NR_1$— ($R_1$ represents a hydrogen atom or lower alkyl).

In the above-mentioned Chemical Formula, X and Y independently represent hydrogen, fluorine, chlorine, cyano, alkyl having 1 to 12 carbon atoms (in some cases, substituted by fluorine or in some cases, one or more non-adjacent alkyl-$CH_2$— groups are substituted by —O—, —CO—O—, or —O—CO— and/or CH=CH—).

In addition, only one type of the photo-alignment material according to the present invention may be used, or two or more types of the photo-alignment materials may be used.

(Solvent)

If a solvent used for the pattern alignment layer composition can dissolve the photo-alignment material and the like at a desired concentration, the solvent is not particularly limited. As an example of the solvent, hydrocarbon solvents such as benzene and hexane, ketone solvents such as methyl ethyl ketone, methyl isobutyl ketone, and cyclohexanone (hereinafter, referred to as "CHN"), ether solvents such as tetrahydrofuran, 1,2-dimethoxyethane, and propylene glycol monoethyl ether (PGME), alkyl halide solvents such as chloroform and dichloromethane, ester solvents such as methyl acetate, ethyl acetate, butyl acetate, and propylene glycol monomethyl ether acetate, amide solvents such as N,N-dimethylformamide, sulfoxide solvents such as dimethyl sulfoxide, anone solvents such as cyclohexane, alcohol solvents such as methanol, ethanol, and isopropyl alcohol (hereinafter, referred to as "IPA"), and the like may be exemplified, but it is not limited thereto. In addition, one type of the solvent may be used, or a mixture of two or more types of the solvents may be used.

The amount of the solvent is preferably in the range of 600 parts by mass or more and 3900 parts by mass or less with respect to 100 parts by mass of the photo-alignment material. If the amount of the solvent is less than 600 parts by mass, there is a possibility that the photo-alignment material is not uniformly dissolved. Therefore, it is not preferable. If the amount of the solvent exceeds 3900 parts by mass, some portion of the solvent remains, and, when the substrate is coated with the pattern alignment layer composition, the remaining solvent permeates into the substrate. As a result, the photo-alignment property and the adherence with respect to the TAC substrate may be deteriorated. Therefore, it is not preferable.

(Adhesion Enhancer)

In addition, although an adhesion enhancer is not a necessary component, the pattern alignment layer composition according to the present invention preferably contains the adhesion enhancer. When the substrate is coated with the pattern alignment layer composition, the adhesion enhancer reacts with the substrate to roughen the surface of the substrate, so that the adhesion enhancer has a function of improving the adherence between the substrate and the alignment layer configured with the cured material of the pattern alignment layer composition.

As an example of the adhesion enhancer, a multi-functional acrylate such as pentaerythritol tetra acrylate (hereinafter, referred to as "PETA") may be exemplified.

In the case of using PETA or the like as the adhesion enhancer, the amount of the adhesion enhancer is preferably 25 parts by mass or less with respect to a total of 100 parts by mass of the photo-alignment material. Since the evaporation rate of PETA is slower than the evaporation rate of PGME, if the amount of the adhesion enhancer exceeds 25 parts by mass, a portion of the solvent permeates into the substrate when the substrate is coated with the pattern alignment layer composition. As a result, the photo-alignment property may be deteriorated. Therefore, it is not preferable.

(Others)

If necessary, various types of additive agent may be included.

[Coating of Pattern Alignment Layer Composition]

If the heat-dried layer 12' having the desired thickness can be formed on the substrate 11 by a method of coating the pattern alignment layer composition, the method is not particularly limited. As a method of coating the pattern alignment layer composition, a gravure coating method, a reverse coating method, a knife coating method, a dip coating method, a spray coating method, an air knife coating method, a spin coating method, a roll coating method, a printing method, an immersing increasing method, a curtain coating method, a die coating method, a casting method, a bar coating method, an extrusion coating method, an E-type coating method, and the like may be exemplified.

If the thickness of the heat-dried layer 12' is in the range where desired flatness can be obtained, the thickness is not particularly limited. However, the thickness of the heat-dried layer 12' is preferably in the range of 0.1 µm to 50 µm, more preferably in the range of 0.1 µm to 30 µm, and even more preferably in the range of 0.1 µm to 10 µm.

Heat-Dried Layer Formation Process

In the heat-dried layer formation process, after the laminate formation process, the heat-dried layer 12' is formed by heating and drying the pattern alignment layer composition.

The heating and drying temperature is preferably in the range of 100° C. or more and 130° C. or less. If the temperature is less than 100° C., there is the possibility that the composition is not uniformly thermally-cured and the thin film does not become uniform. Therefore, it is not preferable. If the temperature exceeds 130° C., there is the possibility that the substrate 11 or the thin film is contracted. Therefore, it is not preferable.

Pattern Alignment Layer Formation Process

In a pattern alignment layer formation process, the pattern alignment layer 12 having a different photo-alignment property is formed by irradiating the heat-dried layer 12' with a polarized light pattern after the heat-dried layer formation process.

The UV light irradiation process of irradiating the heat-dried layer 12' with UV light will be described in detail with reference to FIGS. 2A and 2B.

Figure 2A:
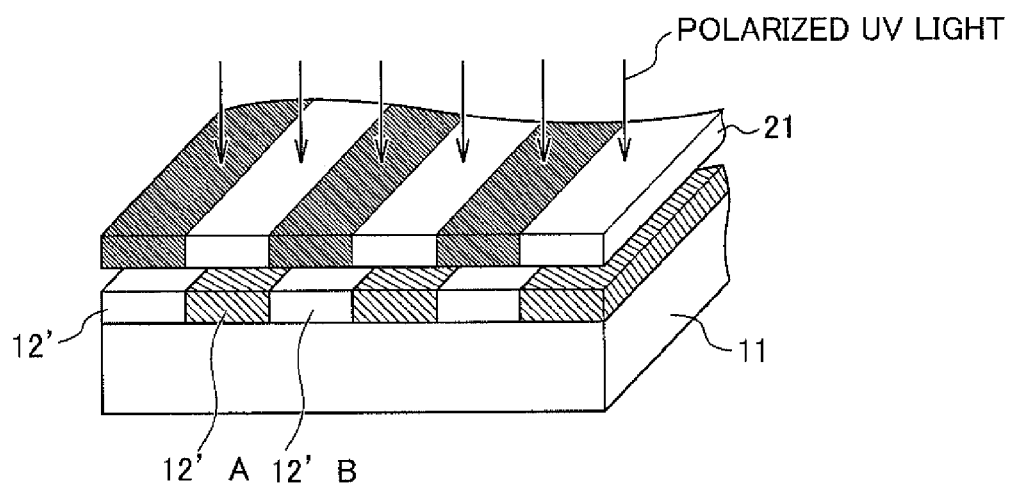
FIGS. 2A and 2B are diagrams schematically illustrating an alignment pattern formation process.
Figure 2B:
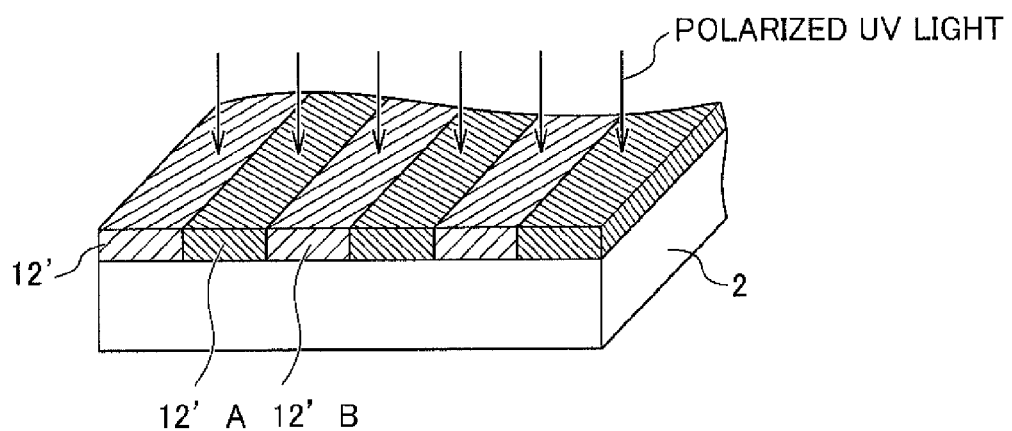

First, as illustrated in FIG. 2A, by irradiating the heat-dried layer 12' with linearly polarized UV light (polarized UV light) by using a mask which does not block the first alignment preparation area 12'A corresponding to the right-eye area and but blocks only the second alignment preparation area 12'B corresponding to the left-eye area, the non-blocked first alignment preparation area 12'A is aligned in the desired direction. Subsequently, as illustrated in FIG. 2B, by irradiating the entire surface of the heat-dried layer 12' with linearly polarized UV light the polarization direction of which is different by 90 degrees from that of the first irradiation, the second alignment preparation area 12'B which is not exposed in the first irradiation is aligned in the desired direction. The two types of the alignment patterns are formed by performing UV light irradiation two times.

In the example illustrated in FIGS. 2A and 2B, first, the first alignment preparation area 12'A is irradiated with polarized UV light, and subsequently, the second alignment preparation area 12'B is irradiated with polarized UV light. However, the order of irradiation is not limited thereto. First, the second alignment preparation area 12'B may be irradiated with polarized UV light, and subsequently, the first alignment preparation area 12'A may be irradiated with polarized UV light.

If the pattern of the mask, that is, the pattern of the pattern irradiation is a pattern capable of stably forming the first alignment area 12A (refer to FIG. 1) corresponding to the right-eye area and the second alignment area 12B (refer to FIG. 1) corresponding to the left-eye area, the pattern is not particularly limited. For example, a stripe shaped pattern, a mosaic pattern, a staggered arrangement pattern, and the like may be exemplified. Among them, a stripe shaped pattern is preferable. Particularly, a stripe shaped pattern where the stripes are parallel to each other in the longitudinal direction of the elongated film is preferable. In other words, as the pattern irradiation, irradiation of polarized UV light on the stripe shaped pattern where the stripes are parallel to each other in the longitudinal direction of the elongated film is preferable. This is because the irradiation position of the polarized UV light is fixed, so that it is possible to easily form the pattern by transporting the elongated film in the longitudinal direction. In addition, this is because it is possible to perform irradiation in the shape of the pattern with high accuracy. In addition, this is because the pattern where the first phase difference area 4A corresponding to the right-eye area and the second phase difference area 4B corresponding to the left-eye area in the phase difference layer 13 are formed and the pattern where the pixels are formed in the color filters or the like used for the display apparatus are easily configured to be in correspondence to each other.

The pattern widths of the mask, that is, irradiation widths and irradiation intervals (non-irradiation width) of polarized UV light may be equal to or different from each other. However, the width of the area corresponding to the right-eye area and the width of the area corresponding to the left-eye area are preferably equal to each other. The reason is as follows. The pattern where the first phase difference area 4A and the second phase difference area 4B in the phase difference layer 13 are formed and the pattern where the pixels are formed are easily configured to be in correspondence to each other. As a result, it is possible to easily manufacture the flat panel display. In the case of positioning the stripe lines of the color filter, irradiation is preferably performed with such a width that the pattern where the area corresponding to the right-eye area and the area corresponding to the left-eye area are formed and the stripe pattern of the color filter are configured to be in correspondence to each other.

For the purpose of 3D display, the pattern width is preferably in the range of 50 µm to 1000 µm, and more preferably in the range of 100 µm to 800 µm. In addition, the pattern width denotes the pattern width of the pattern alignment layer 12 in the state that the substrate 11 included in the phase difference film 2 is stably contracted.

If the desired opening can be formed in the mask, the material constituting the mask is not particularly limited. Metal, quartz, or the like which are rarely deteriorated by UV light may be given as examples of the material constituting the mask. More specifically, a material obtained by patterning a metal substrate such as SUS through an etching process, a laser process, or an electroforming process and, if necessary, applying surface treatment such as nickel plating may be used. In addition, a material having a light shielding film configured with emulsion (silver salt) or chromium on a substrate configured with soda lime glass or quartz may be used.

Among them, a material obtained by patterning synthetic quartz with Cr is preferable. The reason is as follows. Since stability of dimension according to a change in temperature, humidity or the like, and UV light transmittance are excellent, the heat-dried layer 12' constructed with the cured material of the pattern alignment layer composition is irradiated with UV light with high accuracy. As a result, it is possible to form the pattern alignment layer 12 with a high accuracy.

If the pattern can be formed with high accuracy of dimension, the thickness of the synthetic quartz mask is not particularly limited. The thickness of the synthetic quartz mask is preferably in the range of 1 mm to 20 mm, more preferably in the range of 5 mm to 18 mm, and even more preferably in the range of 9 mm to 16 mm. The reason is as follows. Since the thickness is set to be in the above-mentioned ranges, a flexure can be avoided. Therefore, it is possible to obtain a high accuracy of dimension, and it is not too heavy in handling as a photomask.

If the polarization direction of the polarized UV light with respect to the area corresponding to the right-eye area and the polarization direction of the polarized UV light with respect to the area corresponding to the left-eye area are different from each other, the polarization directions of the polarized UV light are not particularly limited. It is preferable that the polarization directions be different from each other by 90 degrees. The reason is as follows. The directions (directions of the phase retardation axes) in which the refractive index between the first phase difference area 4A and the second phase difference area 4B is most increased are perpendicular to each other, so that it is possible to more appropriately manufacture a display apparatus capable of performing 3D display.

When the display apparatus capable of performing 3D display is formed by using the pattern alignment film 1, if the 3D display can be performed with a high accuracy, the "directions which are different by 90 degrees" are not particularly limited. In general, the directions are preferably in the range of 90°±3°, more preferably in the range of about 90°±2°, and even more preferably in the range of about 90°±1°. This is because it is possible to configure a display apparatus capable of performing 3D display with high performance.

The polarized UV light may be condensed or may not be condensed. In the case where the pattern irradiation is performed on the elongated film on the transporting roll, that is, in the case where there is a difference in distance from the light source for the polarized UV light in the area irradiated with the polarized UV light, light condensing in the transporting direction is preferably performed. The reason is as follows. The influence caused by the distance from the light source is reduced, so that it is possible to form the alignment area with high pattern accuracy.

As a generally used condensing method, a method of using a condensing reflection mirror or condensing lens having the desired shape may be exemplified. In the present invention, it is preferable that the polarized UV light becomes parallel light in the direction (width direction) perpendicular to the transporting direction. As a generally used paralleling method, a method of using a condensing reflection mirror or condensing lens having the desired shape may be exemplified.

The wavelength of the polarized UV light is appropriately set according to the photo-alignment material or the like. The wavelength may be set to a wavelength used for allowing a general photo-alignment material to exhibit an alignment regulation force. More specifically, the wavelength of the irradiation light is in the range of 210 nm to 380 nm, preferably in the range of 230 nm to 380 nm, and more preferably in the range of 250 nm to 380 nm.

As a UV light source, a low pressure mercury lamp (a germicidal lamp, a fluorescent chemical lamp, a black light), a high pressure discharge lamp (a high pressure mercury lamp, a metal halide lamp), a short arc discharge lamp (an ultra-high pressure mercury lamp, a xenon lamp, a mercury xenon lamp), and the like may be exemplified. Among them, the metal halide lamp, the xenon lamp, the high pressure mercury lamp, and the like may be preferably used.

If the method of generating the polarized UV light is a method of stably irradiating the polarized UV light, the method of generating the polarized UV light is not particularly limited. A method of irradiating with UV light through a polarizer passing only the light which is polarized in a certain direction may be used.

A polarizer which is generally used for generating polarized light may be used as the above-mentioned polarizer. For example, a method of separating polarized light by using a wire grid polarizer having a slit-shaped opening, a method for separating polarized light by laminating a plurality of quartz plates with the use of Brewster angle, a method of separating polarized light with the use of Brewster angle of a deposited multilayer film having different refractive indexes, and the like may be exemplified.

If an alignment area having the desired alignment regulation force can be formed by the irradiation amount of the polarized UV light, the irradiation amount of the polarized UV light is not particularly limited. For example, in the case where the wavelength is 310 nm, the irradiation amount is preferably in the range of 5 mJ/cm$^2$ to 500 mJ/cm$^2$, more preferably in the range of 7 mJ/cm$^2$ to 300 mJ/cm$^2$, and even more preferably in the range of 10 mJ/cm$^2$ to 100 mJ/cm$^2$. This is because it is possible to form the alignment area having a sufficient alignment regulation force.

If each exposure process can be performed by the above-mentioned irradiation amounts, the irradiation distance of the polarized UV light, that is, the distance in the transporting direction of the elongated film irradiated with the polarized UV light is not particularly limited. The irradiation distance may be appropriately set according to the line speed, or the like. If the irradiation distance is short, there is an advantage in that it is easy to increase the pattern accuracy. If the irradiation distance is long, even in the case where the line speed is high, there is an advantage in that it is possible to obtain the alignment area having a sufficient alignment regulation force. In addition, as a method of increasing the irradiation distance, a method of performing irradiation of polarized UV light several times in each exposure process or a method of widening the irradiation area in the transporting direction may be exemplified.

It is preferable that the temperature be adjusted so that the temperature of the thin film is constant when the thin film is irradiated with the polarized UV light. This is because it is possible to form the alignment area with high accuracy. The temperature of the thin film is preferably in the range of 15° C. to 90° C., and more preferably in the range of 15° C. to 60° C. As a temperature adjusting method, a method of using a temperature adjustment apparatus such as a general heating/cooling apparatus may be exemplified. Specifically, a method of using an air blower capable of blowing air of a predetermined temperature or a method of using a temperature-adjustable transporting unit as the transporting unit may be exemplified. More specifically, a method of using a temperature-adjustable transport roll or belt conveyer or the like may be exemplified.

If the thickness of the pattern alignment layer 12 is in the range where the desired alignment regulation force with respect to the rod-like compound can be exhibited, the thickness is not particularly limited. However, the thickness is preferably in the range of 100 nm to 1000 nm. If the thickness of the pattern alignment layer 12 is less than 100 nm, there is a possibility that the desired alignment regulation force with respect to the rod-like compound cannot be exhibited. Therefore, it is not preferable. If the thickness of the pattern alignment layer 12 exceeds 1000 nm, there is a possibility that the adhesive force is reduced. Therefore, it is not preferable.

2. Formation of Phase Difference Film 2

After the pattern alignment film 1 is formed, the phase difference film 2 is formed by further performing the following processes. First, a phase difference layer formation coating solution coating process of coating the pattern alignment layer 12 of the pattern alignment film 1 with the phase difference layer formation coating solution containing the rod-like compound is performed to form the phase difference layer formation layer. After that, an alignment process of aligning the rod-like compound in an alignment direction different to the alignment direction of the first alignment area 12A corresponding to the right-eye area and the alignment direction of the second alignment area 12B corresponding to the left-eye area, which are included in the pattern alignment layer 12, is performed on the rod-like compound included in the coated film of the phase difference layer formation coating solution. The phase difference layer 13 is formed by the process.

Figure 3:
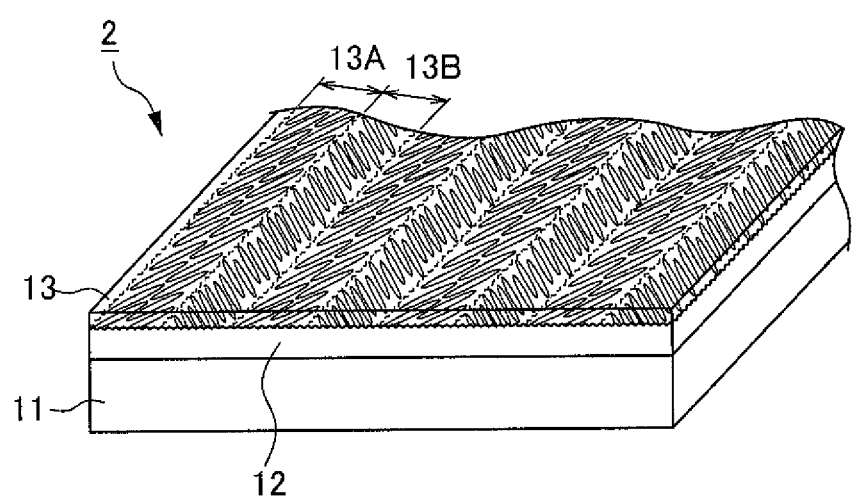
FIG. 3 is a schematic diagram illustrating a patterned phase difference film obtained according to the manufacturing method of the present invention.

Finally, a cutting process of cutting the film to the desired size is performed. The phase difference film 2 illustrated in FIG. 3 is manufactured though the above-described processes.

Phase Difference Layer Formation Coating Solution Coating Process

If the phase difference layer formation coating solution coating method is a method capable of stably forming the coated film of the phase difference layer formation coating solution on the pattern alignment layer 12, the coating method is not particularly limited. The same method as described in the composition coating process may be exemplified.

[Phase Difference Layer 13]

The phase difference layer 13 includes a rod-like compound having a polymerizable functional group in a molecule and exhibiting liquid crystal characteristics. Since the phase difference layer 13 is formed along the alignment pattern, the phase difference layer 13 includes a first phase difference area 4A corresponding to the right-eye area and a second phase difference area 4B corresponding to the left-eye area.

(Rod-Like Compound)

As an example of the rod-like compound, a liquid crystal material may be exemplified. The liquid crystal material has refractive index anisotropy, and the liquid crystal materials are regularly arranged according to the alignment pattern, so that the liquid crystal material has the function of applying the desired phase difference property to the phase difference layer 13. As a liquid crystal material, materials exhibiting a liquid crystal phase such as a nematic phase or a smectic phase may be exemplified. In terms of easiness of regular arrangement in comparison to liquid crystal materials exhibiting different liquid crystal phases, the liquid crystal material exhibiting a nematic phase is more preferably used.

As a liquid crystal material exhibiting the nematic phase, a material having spacers at two mesogenic ends is preferably used. The reason is as follows. Since the liquid crystal material having spacers at two mesogenic ends is excellent in flexibility, it is possible to allow the phase difference film 2 to have excellent transparency by using such a liquid crystal material.

In addition, a liquid crystal material having a polymerizable functional group in the molecule is preferable, and a liquid crystal material having a three-dimensionally cross-linkable polymerizable functional group is more preferable. The reason is as follows. Due to the liquid crystal material having a polymerizable functional group, since the liquid crystal material can be polymerized to be fixed, it is possible to obtain excellent arrangement stability, and it is possible to obtain a phase difference layer 13 the phase difference property of which is not easily changed as time elapses.

Herein, the phrase "three dimensional cross-link" denotes the state of a mesh (network) structure formed by three-dimensionally polymerizing liquid crystal molecules with each other.

As the above-mentioned polymerizable functional group, a polymerizable functional group which polymerizes via an ionizing radiation such as UV light and electron beams, or thermal action may be exemplified. As representative examples of the polymerizable functional group, a radical polymerizable functional group, a cationic polymerizable functional group, and the like may be given. In addition, as representative examples of the radical polymerizable functional group, a functional group having at least one addition-polymerizable ethylenically unsaturated double bond may be given. As specific examples thereof, a vinyl group having or not having a substituent, an acrylate group (a general term including an acryloyl group, a methacryloyl group, an acryloyloxy group, and a methacryloyloxy group), and the like may be given. In addition, as specific examples of the cationic polymerizable functional group, an epoxy group and the like are given. Other examples of polymerizable functional groups include an isocyanate group and an unsaturated triple bond. Among them, in terms of a process, a functional group having an ethylenically unsaturated double bond is very preferably used.

Furthermore, a liquid crystal material having the polymerizable functional group at an end is particularly preferable. The reason is as follows. Due to the use of such a liquid crystal material, since a mesh (network) structure state can be obtained by, for example, three-dimensionally polymerizing the liquid crystal molecules, it is possible to obtain arrangement stability, and it is possible to form the phase difference layer having arrangement stability and excellence in exhibiting optical characteristics. In addition, in the present invention, even in the case of using a liquid crystal material having a polymerizable functional group at one end, the liquid crystal material is cross-linked to other molecules, so that it is possible to obtain arrangement stability.

As specific examples of the liquid crystal material used in the present invention, compounds represented by the following Chemical Formulas (1) to (17) may be given.

(1)
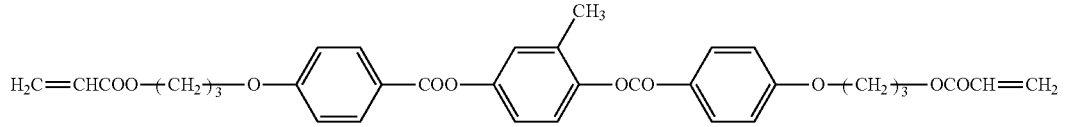
(2)
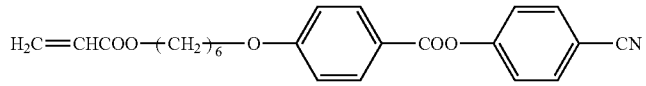
(3)
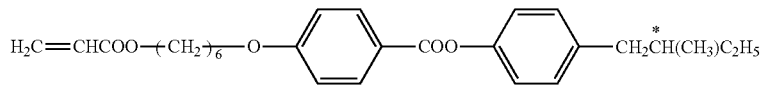
(4)
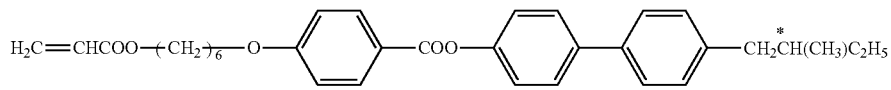
(5)
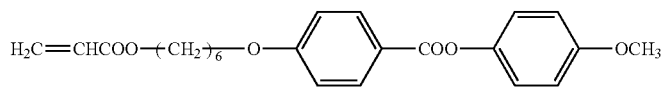
(6)
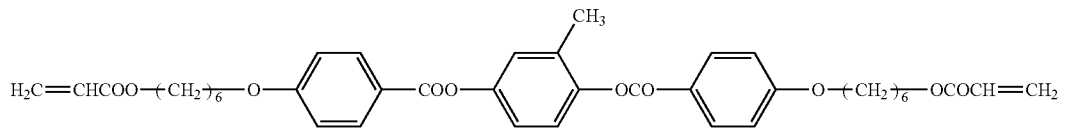
(7)
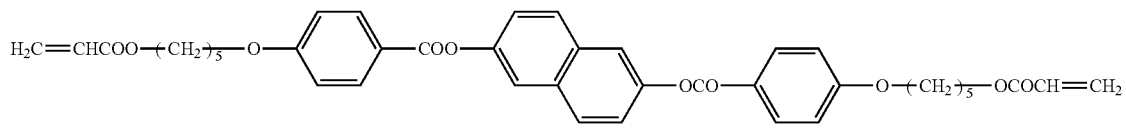
(8)
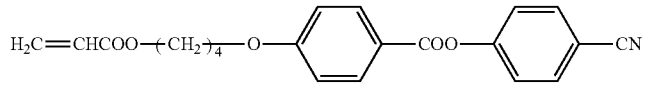
(9)
(10)
(11)
(12)
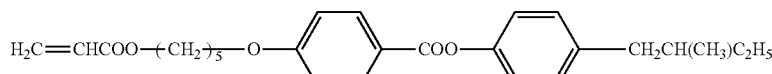
(13)
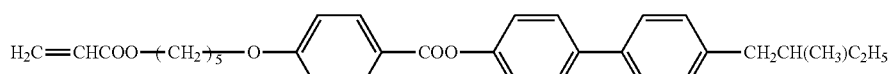
(14)
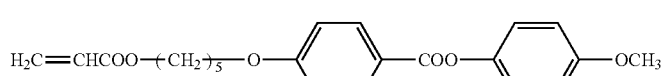

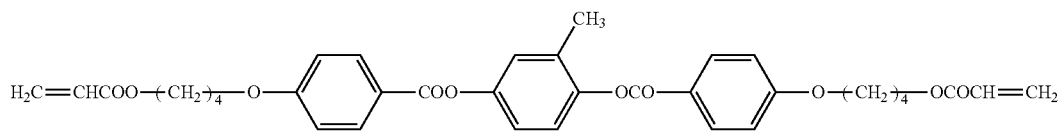

(15)

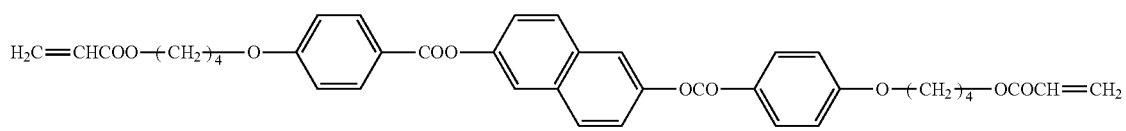

(16)

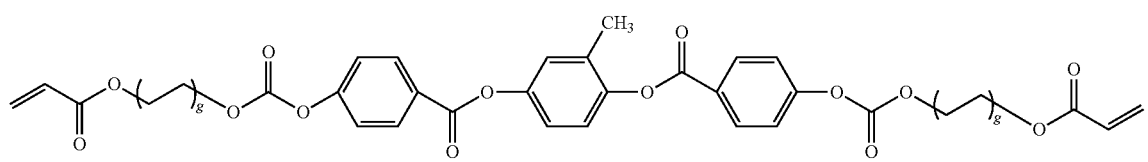

(17)

g: Integer of 2 to 5

In addition, only one type of the liquid crystal material may be used, or a mixture of two or more types of liquid crystal material may be used. For example, if a mixture of a liquid crystal material having one or more polymerizable functional groups at two ends and a liquid crystal material having one or more polymerizable functional groups at one end is used as a liquid crystal material, the mixture of the liquid crystal materials is preferable in terms of the fact that polymerization density (crosslinking density) and optical properties can be arbitrary adjusted by adjusting the mixing ratio of the two liquid crystal materials. In addition, in terms of securing reliability, a liquid crystal material having one or more polymerizable functional groups at two ends is preferable. However, in terms of liquid crystal alignment, it is preferable that one polymerizable functional group be at each of the two ends.

If the viscosity of the phase difference layer formation coating solution can be set to the desired value according to the coating method of coating the pattern alignment layer 12, the amount of the liquid crystal material is not particularly limited. However, the amount of the liquid crystal material in the coating solution is preferably in the range of 5 parts by mass to 40 parts by mass and more preferably in the range of 10 parts by mass to 30 parts by mass. If the amount of the liquid crystal material is less than 5 parts by mass, the amount of the liquid crystal material is too small, so that there is a possibility that the light incident on the phase difference layer 13 is not appropriately aligned. Therefore, it is not preferable. If the amount of the liquid crystal material exceeds 30 parts by mass, the viscosity of the phase difference layer formation coating solution is too high, so that the workability is deteriorated. Therefore, it is not preferable.

If the thickness of the phase difference layer 13 is in the range where a predetermined phase difference property can be obtained, the thickness is not particularly limited. It is preferable that the in-plane phase difference of the phase difference layer 13 correspond to λ/4. Herein, λ is a wavelength of 550 nm. Accordingly, since linearly polarized light beams passing through the phase difference layer 13 can be converted into circularly polarized light beams of which the directions of polarization are perpendicular to each other, it is possible to display a 3D image with a higher accuracy.
(Polymerization Initiator)

In the case of using a rod-like compound as a polymerizable liquid crystal material, it is preferable that a polymerization initiator be added although the polymerization initiator is not a necessary component of the present invention.

As a polymerization initiator, a combination of a photoreduction dye such as benzophenone, o-benzoyl benzoic acid methyl, 4,4-bis(dimethylamine)benzophenone, 4,4-bis(diethylamine)benzophenone, a-amino-acetophenone, 4,4-dichloro benzophenone, 4-benzoyl-4-methyl diphenyl ketone, dibenzyl ketone, fluorenone, 2,2-diethoxy acetophenone, 2,2-dimethoxy-2-phenyl acetophenone, 2-hydroxy-2-methyl propiophenone, p-tert-butyl acetophenone, thioxanthone, 2-methylthioxanthone, 2-chlorothioxanthone, 2-isopropylthioxanthone, diethylthioxanthone, benzyl dimethyl ketal, benzyl methoxyethyl acetal, benzoin methyl ether, benzoin butyl ether, anthraquinone, 2-tert-butyl anthraquinone, 2-amyl anthraquinone, β-chloro-anthraquinone, anthrone, benzanthrone, dibenzosuberone, methylene anthrone, 4-azidobenzyl acetophenone, 2,6-bis(p-azidobenzylidene)cyclohexane, 2,6-bis(p-azidobenzylidene)-4-methylcyclohexanone, 2-phenyl-1,2-butadione-2-(o-methoxycarbonyl)oxime, 1-phenyl-propanedione-2-(o-ethoxycarbonyl)oxime, 1,3-diphenyl-propanetrione-2-(o-ethoxycarbonyl)oxime, 1-phenyl-3-ethoxy-propan-trione-2-(o-benzoyl)oxime, Michler's ketone, 2-methyl-1 [4-(methylthio)phenyl]-2-morpholinopuropan 1-on, 2-benzyl-2-dimethylamino-1-(4-morpholinophenyl)-butanone, naphthalene sulfonyl chloride, quinoline sulfonyl chloride, and n-phenyl thioacridone, 4-azobisisobutyronitrile, diphenyl disulfide, benzothiazole disulfide, triphenylphosphine, camphorquinone, N1717 manufactured by Adeka Corporation, tetrabromomethane, tribromophenyl sulfone, benzoyl peroxide, eosin, methylene blue, and a reducing agent such as an ascorbic acid and triethanolamine may be exemplified. In the present invention, one type or a combination of two or more types of the polymerization initiators may be used.

In the case of using the above-mentioned polymerization initiator, a polymerization initiator aid may be further used together with the polymerization initiator. As the polymerization initiator aid, tertiary amines such as triethanolamine and methyl diethanolamine and benzoic acid derivatives such as 2-dimethylamino ethyl benzoate and 4-dimethylamide ethyl benzoate may be exemplified, but the present invention is not limited thereto.

(Solvent)

In addition, generally, a solvent is used to dissolve the above-mentioned liquid crystal material. As long as a solvent can uniformly dissolve or disperse a liquid crystal material, the solvent is not particularly limited. For example, hydrocarbon solvents such as benzene and hexane, Ketone solvents such as methyl ethyl ketone, methyl isobutyl ketone, and cyclohexanone, ether solvents such as tetrahydrofuran, 1,2-dimethoxyethane, and propylene glycol monoethyl ether (PGME), alkyl halide solvents such as chloroform and dichloromethane, ester solvents such as methyl acetate, ethyl acetate, butyl acetate, and propylene glycol monomethyl ether acetate, amide solvents such as N,N-dimethylformamide, sulfoxide solvents such as dimethyl sulfoxide, anone solvents such as cyclohexane, and alcohol solvents such as methanol, ethanol, and propanol may be used. In addition, one type of the solvent may be used, or a mixture of two or more types of the solvents may be used.

(Other Compounds)

In addition, other compounds may be added within a range where the arrangement order of the liquid crystal material is not detracted. As the other compounds, a polymerization initiator, a polymerization inhibitor, a plasticizer, a surfactant, a silane coupling agent, and the like may be exemplified.

(Thickness of Phase Difference Layer 13)

By containing the rod-like compound, the phase difference layer 13 exhibits the phase difference property, so that the degree of phase difference property is determined based on the type of the rod-like compound and the thickness of the phase difference layer 13. Therefore, if the thickness of the phase difference layer 13 is in the range where a predetermined phase difference property can be obtained, the thickness is not particularly limited. The thickness of the phase difference layer 13 is appropriately determined according to the purpose or the like of the phase difference film 2.

The thickness of the phase difference layer formation layer configured with the phase difference layer formation coating solution is preferably applied in the range where the in-plane phase difference of the phase difference layer 13 which is to be formed later corresponds to $\lambda/4$. The reason is as follows. Namely, linearly polarized light beams passing through the first phase difference area 4A and the second phase difference area 4B can be converted into circularly polarized light beams which have a different rotation direction to each other, so that it is possible to display a 3D image with higher accuracy.

In the case where the thickness of the phase difference layer 13 is set to be a distance in a range where the in-plane phase difference of the phase difference layer 13 corresponds to $\lambda/4$, the specific value of the distance is appropriately determined according to the type of the rod-like compound. In the case of using a general rod-like compound, the distance is in the range of 0.5 μm to 2 μm. However, the distance is not limited thereto.

Alignment Process

In the alignment process, the rod-like compound included in the coated film of the phase difference layer formation coating solution is aligned according to the different alignment directions of the first and second alignment areas 12A and 12B included in the pattern alignment layer 12. If the method of aligning the rod-like compound is a method capable of aligning the rod-like compound in the desired direction, the method is not particularly limited. For example, a method of heating the rod-like compound up to a liquid crystal phase formation temperature or more may be given.

The pattern of the phase difference layer 13 formed by the process becomes the same as the pattern of the pattern alignment layer 12. Therefore, the first phase difference area 4A corresponding to the right-eye area is formed on the first alignment area 12A corresponding to the right-eye area, and the second phase difference area 4B corresponding to the left-eye area is formed on the second alignment area 12B corresponding to the left-eye area.

Whether or not the first phase difference area 4A and the second phase difference area 4B are formed on the phase difference layer 13 can be evaluated, for example, by inserting a sample into light passed through polarizing plates in a crossed-nicols state and checking the existence of inversion of bright lines and dark lines when rotating the sample. In this case, if the pattern configured with the right-eye areas A and the left-eye areas B is fine, the observation may be performed by using a polarizing microscope. In addition, the direction (angle) of the phase delaying axis in each pattern may be measured by using an AxoScan (produced by AXOMETRICS in the USA).

The in-plane phase difference value of the phase difference layer 13 is preferably in the range of 100 nm to 160 nm, more preferably in the range of 110 nm to 150 nm, much more preferably in the range of 115 nm to 135 nm. In addition, in the phase difference layer 13, the in-plane phase difference exhibited by the first phase difference area 4A and the second phase difference area 4B are almost equal to each other except that the directions of the phase retardation axes are different.

Drying Process

Subsequently, the coating film of the phase difference layer formation coating solution is dried.

As a coating film drying method, a generally used drying method such as a heating drying method, a vacuum drying method, and a gap drying method may be used. In addition, the drying method is not limited to only a single method. A plurality of drying methods may be employed in the manner so that the drying methods are sequentially changed, for example, according to the amount of remaining solvent.

In addition, as a coating film drying method, a method of applying a drying wind to the coating film the temperature of which is adjusted to be a certain value can be used. In the case of using the above-mentioned drying method, the speed of the drying wind applied to the coating film is preferably 3 m/s or less, and particularly preferably 0.5 m/s or less.

In addition, as the temperature condition, the temperature is preferable in the range of 40° C. to 150° C., more preferably in the range of 50° C. to 120° C., and particularly preferably in the range of 55° C. to 110° C. In addition, the drying time is preferably in the range of 0.2 to 30 minutes, more preferably in the range of 0.5 minutes to 20 minutes, and particularly preferably in the range of 1 minute to 10 minutes. The reason is as follows. Due to the above-mentioned conditions, it is possible to stably remove the solvent, and it is possible to obtain heat enough to align the liquid crystal molecules.

As the timing of performing the drying process, the drying process may be performed after the alignment process or in parallel with the alignment process.

Rod-Like Compound Curing Process

In the case where the rod-like compound is a polymerizable material, a curing process of polymerizing and curing the polymerizable rod-like compound may be included. In addition, a method of polymerizing a polymerizable rod-like compound may be arbitrarily determined according to the type of the polymerizable functional group having a polymerizable rod-like compound. However, a curing method using irradiation of actinic radiation is preferable. If the actinic radiation is radiation capable of polymerizing a polymerizable rod-like compound, the actinic radiation is not particularly limited. Generally, in terms of availability or the like of an apparatus, UV light or visible light is preferably used. More specifically, the same UV light as used for forming the pattern alignment layer 12 may be used. Due to the curing process, since a mesh (network) structure state can be obtained by polymerization, it is possible to obtain arrangement stability, and it is possible to form the phase difference layer 13 capable of excellently exhibiting optical characteristics.

Exposure Time

In the present invention, during the process after the heat-dried layer 12' is formed until the phase difference layer 13 is formed, the exposure time when the heat-dried layer 12' and the pattern alignment layer 12 are exposed to air is four hours or less. The exposure time is preferably one hour or less. If the exposure time exceeds four hours, the alignment property of the phase difference film 2 may be deteriorated. Therefore, it is not preferable.

As a first aspect for suppressing the exposure time down to four hours or less, a method of winding a laminate configured with the substrate and the heat-dried layer 12' or the pattern alignment layer 12 around a roll after the formation of the heat-dried layer 12' or after the formation of the pattern alignment layer 12 may be exemplified. The method of winding the laminate around a roll is not particularly limited. More specifically, a method of allowing the coating surface and the rear surface to be in direct contact with each other, a method allowing the coating surface and the rear surface not to be in direct contact with each other by inserting an intermediate paper, and the like may be exemplified.

In the case where roll shaping is performed, although the procedure proceeds to the next process when a time (for example, 10 hours) exceeding four hours elapses after the roll shaping, it is possible to obtain a high alignment property. This is very appropriate in the case where (A) a coating apparatus of coating with a pattern alignment layer composition and (B) an apparatus used for forming a phase difference layer containing a rod-like compound are not installed in the same production line and the phase difference film 2 cannot be continuously produced. In the case where the roll shaping is not performed, the manufacturing plan needs to be set so as to sequentially use both the apparatus associated with (A) and the apparatus associated with (B). On the other hand, if the roll shaping is performed, in the case when the roll shaping is not being performed, even at the time when the phase difference layer 13 is to be formed by operating the apparatus associated with (B), other products may be manufactured by using the apparatus, and after that, the phase difference layer 13 can be formed. For this reason, the production line is very easy to plan, so that it is possible to greatly improve the operation rate.

As a second aspect for suppressing the exposure time down to four hours or less, a method of continuously performing the processes in the same production line after the heat-dried layer 12' is formed until the phase difference layer 13 is formed is exemplified.

Figure 4:
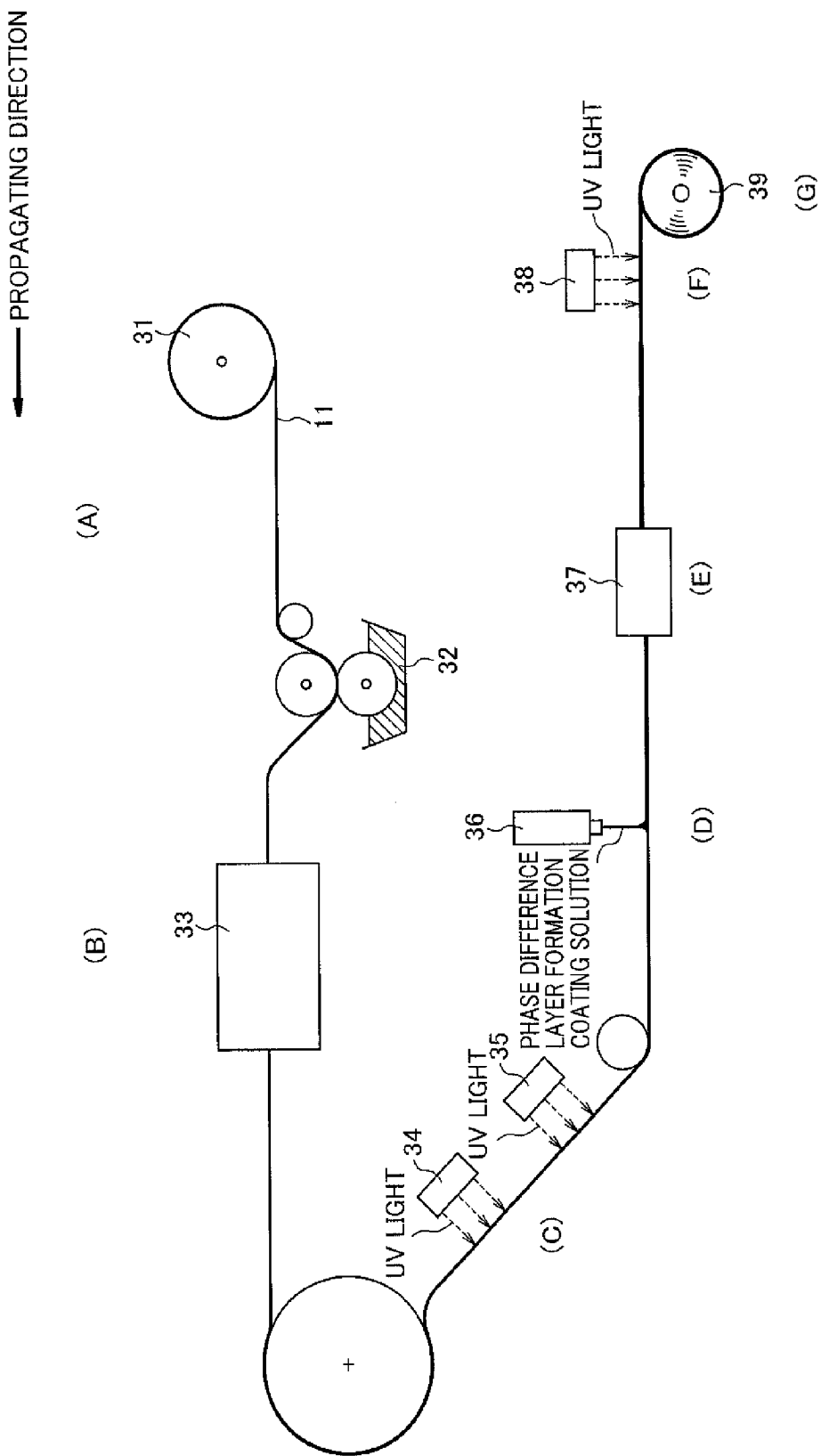
FIG. 4 is a schematic diagram illustrating processes in a case of continuously manufacturing the patterned phase difference film in the same production line.
Figure 5:
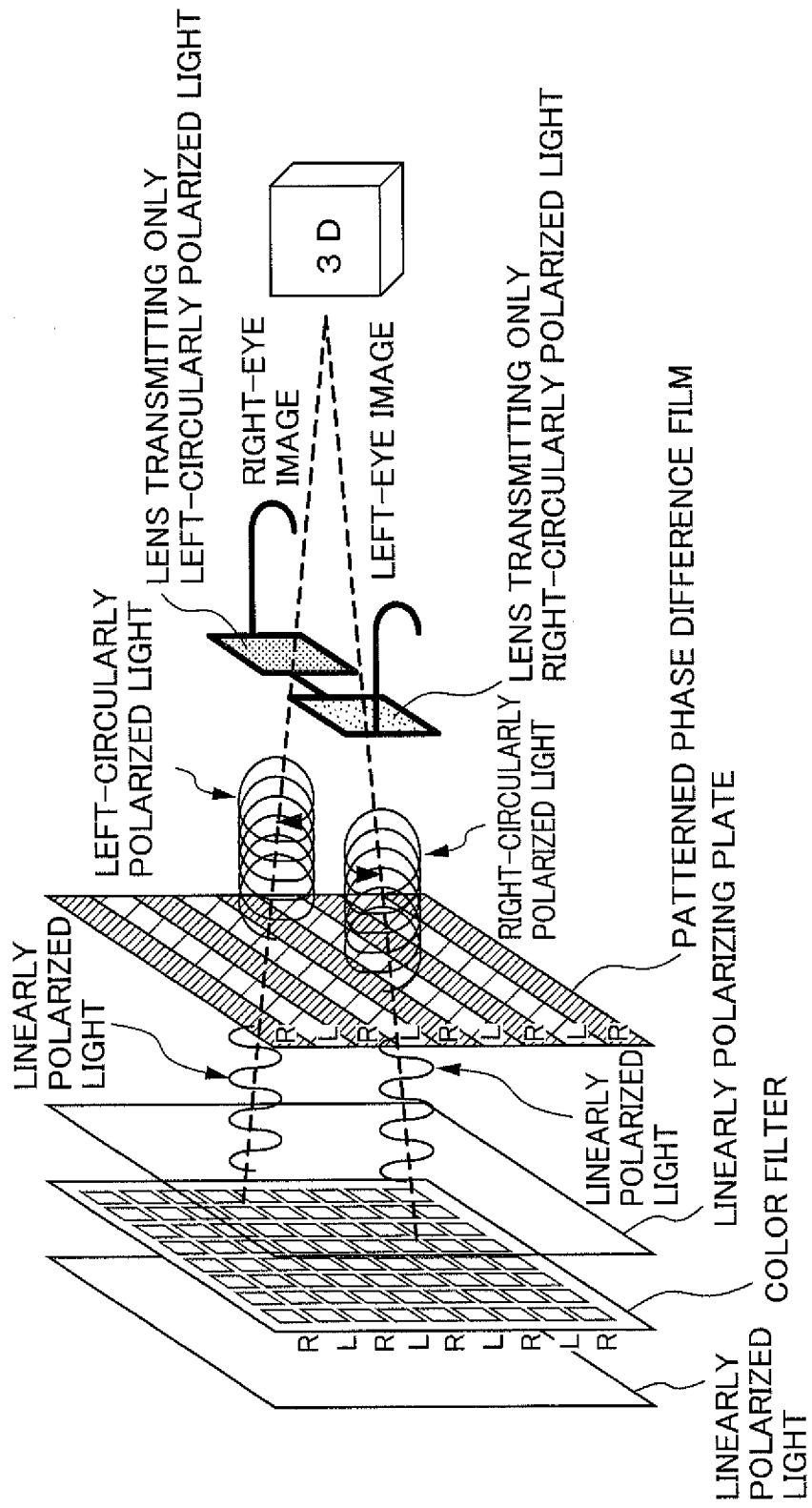
FIG. 5 is a diagram for explaining passive-type 3D image display.

FIG. 4 is a schematic diagram illustrating the case of continuously performing the processes in the same production line after the heat-dried layer 12' is formed until the phase difference layer 13 is formed.

(A) First, the substrate 11 is provided from the elongated film wound around the roll 31, and the substrate 11 is coated with a pattern alignment layer composition 32.

(B) Subsequently, the heat-dried layer 12' is formed to be in a thin-film state by thermally curing the composition by using a dryer 33.

(C) Subsequently, the heat-dried layer 12' is irradiated with UV light emitted from UV light irradiation apparatuses 34, 35.

(D) Subsequently, the phase difference layer formation layer is formed by coating with the phase difference layer formation coating solution supplied from a phase difference layer formation coating solution supply apparatus 36.

(E) Next, by heating the rod-like compound contained in the coating film of the phase difference layer formation coating solution up to the liquid crystal phase formation temperature or more by using a dryer 37, the rod-like compound is aligned along the alignment direction which is different from the first alignment area 12A corresponding to the right-eye area and the second alignment area 12B corresponding to the left-eye area included in the pattern alignment layer 12. Through the process, the phase difference layer formation layer is converted into the phase difference layer 13.

(F) Next, the polymerizable rod-like compound is polymerized and cured by using a UV light irradiation apparatus 38.

(G) Next, after the film is wound around the winding roll 39, a cutting process of cutting the film to the desired size is performed. Through the process, the phase difference film 2 is manufactured.

Very Appropriate Example of Use

The phase difference film 2 is very appropriately used for a flat panel display for 3D display. If the phase difference film 2 is used for the flat panel display for 3D display, it is possible to obtain a particular effect in that the photoalignment property and adherence with respect to the substrate 11 are excellent.

EXAMPLES

Hereinafter, the present invention will be described more in detail by using examples. However, the present invention is not limited to the following examples.

TABLE 1

|  | Substrate | Shape after heating and drying | Time from heating and drying to irradiation of light pattern | From irradiation of polarized UV light to coating with rod-like compound |
|---|---|---|---|---|
| Example 1 | TAC | Sheet shape | 1 hour | Just after |
| Example 2 | TAC | Sheet shape | 4 hours | Just after |
| Example 3 | TAC | Roll shape | 1 hour | Just after |
| Example 4 | TAC | Roll shape | 4 hours | Just after |

TABLE 1-continued

| | Substrate | Shape after heating and drying | Time from heating and drying to irradiation of light pattern | From irradiation of polarized UV light to coating with rod-like compound |
|---|---|---|---|---|
| Example 5 | TAC | Roll shape | 10 hours | Just after |
| Example 6 | TAC | — | Just after | Just after |
| Example 7 | Alkyl polymer | Roll shape | 1 hour | Just after |
| Comparative Example 1 | TAC | Sheet shape | 10 hours | Just after |
| Comparative Example 2 | TAC | Sheet shape | 1 hour | 4 hours |

Example 1

100 parts by mass of a photo-alignment material having photodimerization portions and thermal crosslinked portions (product name: ROP-103, produced by Rolic Co., Ltd.) was dissolved in 900 parts by mass of a mixed solvent of PGME, IPA, and CHN so that a pattern alignment layer composition according to Example 1 was obtained. The ratio of PGME, IPA, and CHN in the mixed solvent was 75:20:5 by volume.

Next, the rear surface of the TAC substrate (product name: TD60UL-P, thickness 60 μm, produced by Fuji Film Co., Ltd.) the front surface of which had antiglare treatment, was coated with the pattern alignment layer composition by using a die coating method so that the film thickness after curing was 200 nm. Next, by heating at 100° C. for 2 minutes, the solvent was allowed to evaporate and the acrylic resin composition was allowed to be thermally cured. Accordingly, a cured film having a thickness of 200 nm was formed.

After the cured film was retained in a sheet shape for one hour, the cured film was irradiated with polarized UV light (polarization axis being inclined by 45° with respect to the transporting direction of the film) in the direction parallel to the transporting direction of the original fabric through a wire grid polarizer by using a mask where a stripe pattern having a width of 500 μm was formed with chromium on synthetic quartz. Subsequently, the film was irradiated with polarized UV light (polarization axis being inclined by −45° with respect to the transporting direction of the film) through a wire grid polarizer by using no mask. At this time, a "H Bulb" (produced by Fusion UV Systems, Inc.) was used as a UV light irradiation apparatus. In addition, the wavelength of polarized UV light was set to 313 nm, and the accumulated light amount was set to 40 mJ/cm². The accumulated light amount was measured by using a UV light intensity meter "UV-351" (produced by ORC Manufacturing Co., Ltd). Through the above-described processes, the pattern alignment film according to Example 1 was obtained.

Subsequently, after the irradiation of polarized UV light, without taking a pause in time, the pattern alignment layer of the pattern alignment film was coated with a liquid crystal material (product name: Licrivue (registered trade mark) RMS03-013C, produced by Merck) dissolved in propylene glycol monomethyl ether acetate (PEGMEA) by using a die coating method so that the final thickness is 1 μm. Next, heating was performed on a hot plate at 60° C. for 2 minutes. After cooling was performed down to near room temperature, UV light having a wavelength of 365 nm was irradiated by using the above-mentioned UV light irradiation apparatus until the accumulated light amount was 300 mJ/cm². Through the above-described processes, the phase difference film according to Example 1 was obtained.

Example 2

The pattern alignment layer composition, the pattern alignment film, and the phase difference film according to Example 2 were obtained by using the same method as that of Example 1 except that the cured film was retained in a sheet shape for four hours.

Example 3

The pattern alignment layer composition, the pattern alignment film, and the phase difference film according to Example 3 were obtained by using the same method as that of Example 1 except that the cured film was wound around the roll and was retained for one hour without taking a pause in time after the formation of the cured film and, after the cured film was extracted in a sheet shape, the cured film was irradiated with polarized UV light.

Example 4

The pattern alignment layer composition, the pattern alignment film, and the phase difference film according to Example 4 were obtained by using the same method as that of Example 1 except that the cured film was wound around the roll and was retained for four hours without taking a pause in time after the formation of the cured film and, after the cured film was extracted in a sheet shape, the cured film was irradiated with polarized UV light.

Example 5

The pattern alignment layer composition, the pattern alignment film, and the phase difference film according to Example 5 were obtained by using the same method as that of Example 1 except that the cured film was wound around the roll and was retained for 10 hours without taking a pause in time after the formation of the cured film and, after the cured film was extracted in a sheet shape, the cured film was irradiated with polarized UV light.

Example 6

The pattern alignment layer composition, the pattern alignment film, and the phase difference film according to Example 6 were obtained by using the same method as that of Example 1 except that the cured film was continuously web-transported and was irradiated with polarized UV light without taking a pause in time after the formation of the cured film, and the film was coated with a liquid crystal material without taking a pause in time after the irradiation of polarized UV light.

Example 7

The pattern alignment layer composition, the pattern alignment film, and the phase difference film according to Example 7 were obtained by using the same method as that of Example 1 except that the substrate is a film having a thickness of 40 μm which is configured with acrylic polymers the front surface of which received antiglare treatment for haze 10%.

Comparative Example 1

The pattern alignment layer composition, the pattern alignment film, and the phase difference film according to Comparative Example 1 were obtained by using the same method as that of Example 1 except that the cured film was retained in a sheet shape for 10 hours.

Comparative Example 2

The pattern alignment layer composition, the pattern alignment film, and the phase difference film according to Comparative Example 2 were obtained by using the same method as that of Example 1 except that the pattern alignment layer of the pattern alignment film was coated with a liquid crystal material after four hours had elapsed after the irradiation of polarized UV light.

Evaluation of Outer Appearance

First, the outer appearance of the phase difference film according to Examples and Comparative Examples was evaluated. The evaluation of outer appearance was performed as follows. Polarizing plates (product name: HCL2-5618HCS, produced by Sanritz Corporation) were attached to two surfaces of a phase difference film so as to be in crossed-nicols arrangement. Next, the attached member was installed in a backlight for a liquid crystal display, and the degree of cloudiness of the front surface of the member was visually observed. The case where the degree of cloudiness is low and no alignment defect is observed is set to be "good", and the case where the degree of cloudiness is high and an alignment defect is observed is set to be "bad". The result was listed in Table 2.

In addition, the luminance was measured in the crossed-nicols state. The luminance meter used at this time is BM-7 (produced by Topcon). The luminance of the backlight was 1000 $cd/cm^2$, and the luminance of the polarizing plate crossed-nicols is 0.1 $cd/cm^2$. The result was listed in Table 2.

Evaluation of Adherence

The evaluation of the phase difference layer was performed by a cross-cut test method regulated in the JIS K-5400 method as follows. The phase difference layer was cut with a cutter knife by using a 100-mass cross cutter guide (product name, produced by Cortec Co., Ltd.) of 10 masses in the vertical direction and 10 masses in the horizontal direction where a mass square has the size of 1 mm per mass. Cellophane adhesive tape (Cellotape, product name, produced by Nichiban Co., Ltd.) was attached to the cut phase difference layer. After one minute from the time of attachment of the cellophane adhesive tape, by grasping the edge of the cellophane adhesive tape, the cellophane adhesive tape was allowed to be at a right angle with respect to the phase difference layer. The number of masses of the phase difference layer (the number of masses of the phase difference layer remaining on the pattern alignment layer without being peeled off from the pattern alignment layer) formed on the pattern alignment layer at the time of peeling off the cellophane adhesive tape was measured. The average values of the number of masses of the phase difference layer formed on the pattern alignment layer when performing this measurement 5 times are listed in Table 2.

Evaluation of In-plane phase difference and Alignment property

The in-plane phase difference and alignment property was obtained by using a phase difference measuring device Axostep (produced by Axometrics, Inc.) by measuring the average of Re values and the variation of the optical axis with respect to nine measurement samples. In the specification, the variation of the optical axis is defined by the standard deviation of the Re value. The result is listed in Table 2.

TABLE 2

|  | Example | | | | | | | Comparative Example | |
|---|---|---|---|---|---|---|---|---|---|
|  | 1 | 2 | 3 | 4 | 5 | 6 | 7 | 1 | 2 |
| Outer appearance (Degree of cloudiness) | Good | Good | Good | Good | Good | Good | Good | Bad | Bad |
| Luminance (cd/cm2) | 5 | 7 | 4 | 6 | 9 | 5 | 5 | 11 | 13 |
| Adherence | 100 | 100 | 100 | 100 | 100 | 100 | 100 | 100 | 90 |
| In-plane phase difference (Unit: nm) | 124 | 110 | 125 | 126 | 124 | 125 | 125 | 20 | 60 |
| Variation in optical axis (Unit: nm) | 0.4 | 0.6 | 0.35 | 0.54 | 0.57 | 0.35 | 0.4 | 1.14 | 1.22 |

It was observed that the case where the exposure time of the heat-dried layer 12' and the pattern alignment layer 12 to air is four hours or less during the processes from the forming of the heat-dried layer 12' to the forming of the phase difference layer 13 has a higher photo-alignment property than the case where the exposure time is more than four hours (Examples 1 to 7).

It was observed that in the case where the exposure time was allowed to shorten by continuously performing the processes from the forming of the heat-dried layer 12' and to the forming of the phase difference layer 13 in the same production line, the exposure time was very appropriately four hours or less (Example 2), more appropriately one hour or less (Examples 1 and 6).

It was observed that in the case where the exposure time was allowed to shorten by allowing the laminate to be wound around a roll to be retained after the forming of the heat-dried layer 12' or after the forming of the phase difference layer 13, although the laminate was retained for about 10 hours until the next process was performed, it was possible to obtain the phase difference film having the same quality as that of the case where the procedure proceeded to the next process without a pause in time. This is very appropriate in the case where (A) the coating apparatus for coating with the pattern alignment layer composition and then (B) the apparatus used for forming the phase difference layer containing the rod-like compound when forming the pattern alignment film do not exist in the same production line. More specifically, even at the time point when the phase difference layer is to be formed by operating the above-mentioned apparatus (B), other products may be produced by using the apparatus, and after that, the phase difference layer may be formed. As a result, the production line is very easy to plan, and the operation rate can be greatly improved.

On the other hand, it was observed that if the exposure time exceeds four hours, the photo-alignment property of the patterned phase difference film is greatly deteriorated (Comparative Examples 1 and 2).

The invention claimed is:

1. A method for manufacturing a patterned phase difference film comprising:
    forming a laminate by coating a substrate with a pattern alignment layer composition for forming a pattern alignment layer containing a photo-alignment material exhibiting a photo-alignment property through irradiation of polarized light;
    forming a heat-dried layer by heating and drying the pattern alignment layer composition after the forming of the laminate and then immediately winding the laminate in a roll shape without taking a pause in time;
    within four hours of winding the laminate in a roll shape, extracting the laminate in a sheet shape and immediately forming a pattern alignment layer having a different photo-alignment property by irradiating the heat-dried layer with a polarized light pattern; and
    forming a phase difference layer containing a rod-like compound having a polymerizable functional group in a molecule exhibiting liquid crystal characteristics on the pattern alignment layer after the forming of the pattern alignment layer.

2. The method for manufacturing a patterned phase difference film according to claim 1, wherein the patterned phase difference film has a black luminance at an extinction position of polarizing plates at a crossed-nicols state of 6 cd/cm$^2$ or less.

3. The method for manufacturing a patterned phase difference film according to claim 2, wherein the photo-alignment material has both a photodimerization portion and a thermal crosslinked portion.

4. The method for manufacturing a patterned phase difference film according to claim 3, wherein the substrate is a substrate subjected to antiglare treatment.

5. The method for manufacturing a patterned phase difference film according to claim 2, wherein the substrate is a substrate subjected to antiglare treatment.

6. The method for manufacturing a patterned phase difference film according to claim 1, wherein the photo-alignment material has both a photodimerization portion and a thermal crosslinked portion.

7. The method for manufacturing a patterned phase difference film according to claim 6, wherein the substrate is a substrate subjected to antiglare treatment.

8. The method for manufacturing a patterned phase difference film according to claim 1, wherein the substrate is a substrate subjected to antiglare treatment.

* * * * *